(12) United States Patent
Raghunandan et al.

(10) Patent No.: US 7,158,305 B2
(45) Date of Patent: Jan. 2, 2007

(54) ILLUMINATION SYSTEM OPTIMIZED FOR THROUGHPUT AND MANUFACTURABILITY

(75) Inventors: Shyam Raghunandan, Briarcliff Manor, NY (US); Kanti Jain, Hawthorne, NY (US); Marc I. Zemel, West Harrison, NY (US); Marc A. Klosner, White Plains, NY (US); Sivarama K. Kuchibhotla, Croton on Hudson, NY (US)

(73) Assignee: Anvik Corporation, Hawthorne, NY (US)

( * ) Notice: Subject to any disclaimer, the term of this patent is extended or adjusted under 35 U.S.C. 154(b) by 135 days.

(21) Appl. No.: 10/879,887

(22) Filed: Jun. 29, 2004

(65) Prior Publication Data

US 2006/0001845 A1    Jan. 5, 2006

(51) Int. Cl.
*G02B 5/02* (2006.01)
*G02B 6/26* (2006.01)
*G02B 6/10* (2006.01)
*F21V 7/04* (2006.01)

(52) U.S. Cl. .................... 359/599; 385/43; 385/129; 385/146; 362/551

(58) Field of Classification Search ................ 359/738, 359/599, 900; 385/88, 43, 129, 132, 133, 385/146; 362/551
See application file for complete search history.

(56) References Cited

U.S. PATENT DOCUMENTS 6,976,778 B1 * 12/2005 Kamijima .................... 362/583

* cited by examiner

Primary Examiner—Ricky Mack
Assistant Examiner—Jack Dinh
(74) Attorney, Agent, or Firm—Carl C. Kling

(57) ABSTRACT

An optimized illumination system that efficiently produces uniform illumination for exposure, photoablation, and laser crystallization systems. The illumination system includes a homogenizer that uniformizes and shapes a light beam, which is directed onto a mask by condenser optics. The illumination system recycles radiation by directing light reflected by the mask back into the illumination system, where an apertured mirror situated at the input end re-directs it back toward the mask. The relative areas of the mirror and aperture affect recycling efficiency and system throughput, so the system features a larger-diameter recycling segment enabling greater mirror-to-aperture area ratios. An added segment at the output end of the homogenizer matches the homogenizer diameter to the projection imaging system object field size. This standardizes the homogenizer and condenser lens integration, reducing the need for customized parts and thus reducing manufacturing time and expense.

2 Claims, 9 Drawing Sheets

ILLUMINATION SYSTEM OPTIMIZED FOR THROUGHPUT AND MANUFACTURABILITY

BACKGROUND OF THE INVENTION

1. Field of the Invention

This invention relates to imaging systems for creating desired radiation patterns on radiation-sensitive surfaces such as substrates used in microelectronics circuits and boards, and more particularly relates to homogenizer systems, which provide radiation of uniform intensity for the imaging system, ensuring uniform radiation dosage and high efficiency, allowing for high-speed manufacturing.

2. Description of Related Art

Large-area lithographic exposure systems are required as production tools for the manufacturing of numerous products, including multi-chip modules for high-density electronic packaging, flat-panel displays, printed circuit boards, and semiconductor integrated circuits. Many types of exposure systems are used in the industry, including contact tools, proximity tools, projection imaging tools, and direct-write tools. Such systems are often referred to as patterning tools or photolithographic systems.

Of these, the most desirable exposure systems are the projection imaging tools because they provide non-contact imaging, large-area exposure capability, batch processing, and high throughput. Projection imaging systems typically include illumination, imaging, and motion control subsystems. Projection imaging systems employing ultraviolet light sources, particularly excimer lasers, are especially attractive because they enable high-volume cost-effective production.

To manufacture the variety of products noted previously, projection imaging systems operate at certain resolutions, depending upon the dimensions of the features that are patterned; and at certain fluence levels, depending upon the type of process that is being performed.

For example, common processes are resist exposure, polymer photoablation, and silicon crystallization. Each of these processes requires a different fluence level, and has different illumination uniformity requirements, and thus each has specific requirements for the illumination system.

Resist Exposure

For resist exposure systems, illumination uniformity requirements are not very stringent, since uniform dosage is readily achieved given that the total dose is simply the sum of the doses received from each individual pulse, as the substrate is scanning. The most easily met requirements are for resist exposure systems that perform scanning exposures such that the dosage is delivered over many illumination pulses. For these illumination systems, fluence levels on the substrate of the order of 1–10 mJ/cm$^2$ are sufficient to expose typical resists having dosage requirements ranging from tens to hundreds of mJ/cm$^2$. Thus, the relatively low fluence requirement and relatively high number of pulses allows some tolerance of non-uniform illumination and requires less radiation dosage for a given pulse.

Polymer Photoablation

For ablation systems, the illumination uniformity requirements are more stringent, since ablation depth per pulse is not strictly linearly proportional to the energy/area, and thus the doses are not strictly additive (as they are for resist exposure). Here, the minimum fluence levels on the substrate are determined by the ablation threshold of the material, ranging from 50 mJ/cm$^2$ for materials such as polyimide to over 500 mJ/cm$^2$ for certain composite materials. As with resist exposure systems, ablation can occur over multiple pulses by scanning the substrate through the illumination region, so that the desired ablation depth is reached. The multiple-pulse aspect of a typical ablation process, like resist exposure processes, allows some tolerance of less uniform illumination.

Silicon Crystallization

Silicon crystallization is a single-shot process, so fluence levels must be relatively high—on the order of 1000 mJ/cm$^2$. This high throughput is necessary in order to melt silicon film layers that recrystallize upon solidification. Since crystallization is a single pulse process, however, it requires superior illumination uniformity to achieve a uniform response over the entire illuminated area.

The critical parameters noted above, namely the illumination uniformity and fluence (energy per area), are tailored by means of the illumination system. The key subsystems of the illumination system are the homogenizer and the condenser subsystem. The homogenizer uniformizes and shapes the output beam from the illumination source, such as a laser. The condenser subsystem images the output from the homogenizer onto a pattern selection device such as a mask. In many current illumination systems, the homogenizer is a light tunnel with a hexagonal shape; and the condenser subsystem is a simple imaging system, typically magnifying by a factor of 1–5×. These current illumination systems call for custom homogenizer and condenser subsystem designs to ensure that the required illumination uniformity and fluence are achieved.

Additionally, to improve the throughput of the illumination system, the homogenizer may use a recycling element. This recycling element may consist of a highly reflective mirror situated on the input end of the homogenizer, which reflects—back into the homogenizer—light that is back-reflected from the mask, thereby significantly increasing the effective throughput of the illumination system. Note that this recycling element has an aperture on center to allow focused light from the laser to initially enter the homogenizer. While this hole is necessary to let illumination enter the homogenizer, it results in a decrease in the recycling efficiency, due to losses of light back-reflected through the aperture.

BRIEF SUMMARY OF THE INVENTION

To improve the uniformization achieved by a light-tunnel homogenizer, the homogenizer must be configured to provide an increased number of bounces to the radiation to be uniformized. Increasing the number of bounces requires either an increase in the length of the homogenizer or a decrease in the diameter. The first approach, increased homogenizer length, increases cost of the illumination system. The second approach, decreased homogenizer diameter, also decreases recycling efficiency because the radiation entrance aperture area becomes a greater fraction of the recycling mirror area, allowing more radiation to escape.

This invention provides a homogenizer with two sections: a section of larger diameter to enable high recycling efficiency, and a section of smaller diameter to provide a high degree of uniformization. These sections can be assembled from a set of modular segments, enabling rapid, low-cost production of different illumination system designs.

The invention also includes the use of a larger-diameter final section that helps match the illumination system to a condenser system. This simplifies the integration of condenser systems with the illumination system, further reducing production time and cost.

It is the object of this invention to improve recycling efficiency of illumination subsystems and thus the throughput of overall exposure systems.

Another object of the invention is to facilitate modular illumination system construction techniques that decrease manufacturing time and cost.

A feature of this invention is a short recycling optimizing segment added to the input-end of the homogenizing section, the recycling optimizing segment being larger in diameter than the segments in the homogenizing section.

Another feature of this invention is a standardized system comprising multiple optical segments of common sizes that may be configured to suit the needs of varying applications.

Still another feature of the invention is a set of short condensing extension segments to be added to the output end of the homogenizing section, where the size of the condensing segment is chosen to match the condenser magnification to the projection lens object/image field size.

An advantage of the invention is additional recycling efficiency gained by making the recycling segment larger in diameter than the homogenizer segments, thus increasing the ratio of the area of the recycling mirror to the homogenizer input aperture.

Another advantage of the invention is that the standardized design of the segments allows illumination systems quickly to be constructed using a selected number of extension segments, saving the cost and time required to develop and fabricate designs customized for specific lengths and for specific condenser lens assemblies.

Still another advantage of the invention is additional system efficiency gained by increasing homogenizer efficiency so more energy reaches the image plane, which allows greater lithography system throughput in a production environment.

Other objects, features, and advantages of the invention will be apparent to those skilled in the art from the following written description, claims, abstract, and the annexed drawings.

DETAILED DESCRIPTION OF THE INVENTION

Homogenizer with Energy Recycling

Figure 11:
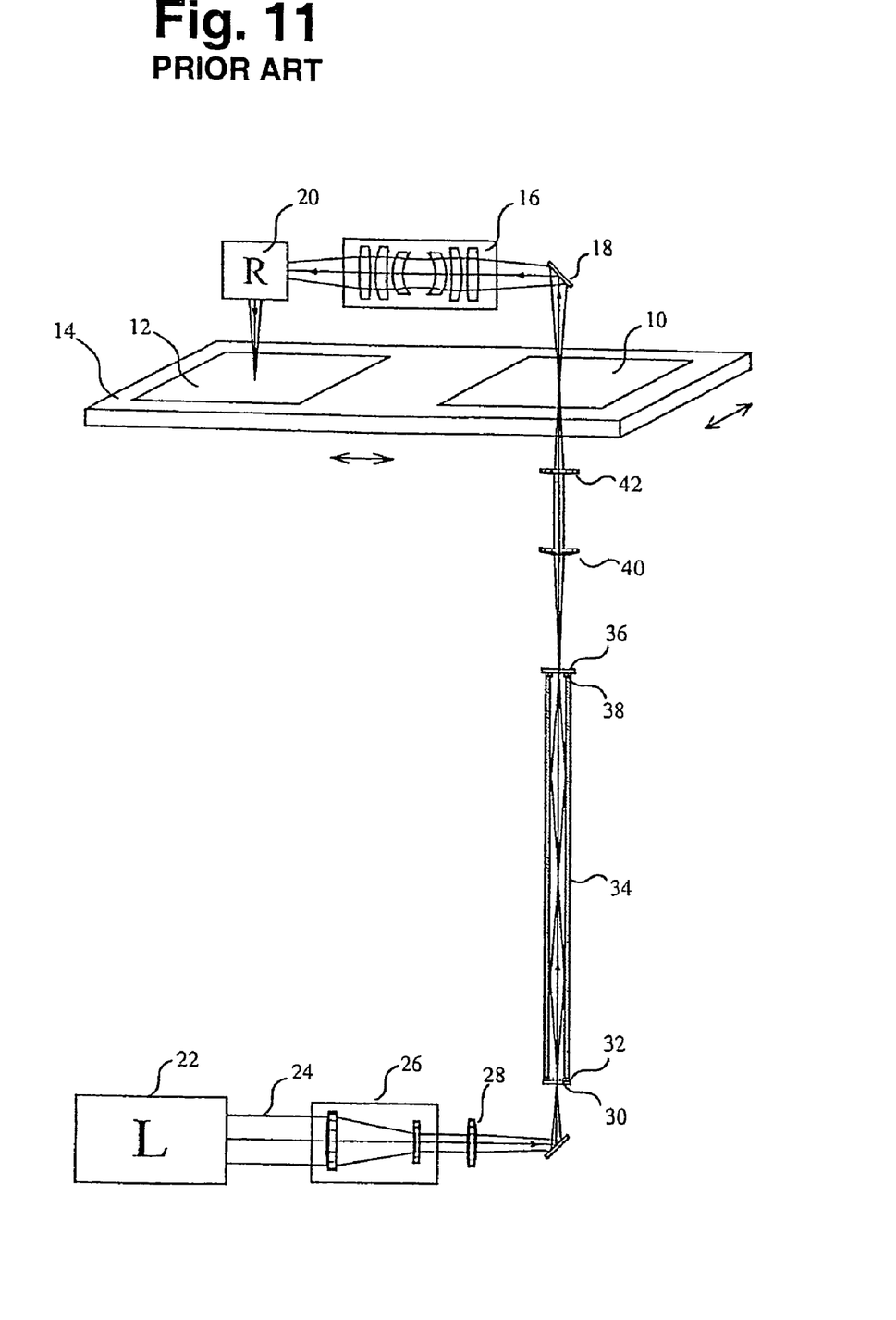
FIG. 11 shows a prior art lithography system, in which the homogenizer and illumination system produce uniform hexagonal illumination that is incident upon the mask, and in which the illuminated mask is imaged onto the substrate by the projection lens.

The high-efficiency energy-recycling system is schematically illustrated in FIG. 11 as part of an illumination system optimized for resist exposure, photoablation, or crystallization. The patterning mask 10 and substrate 12 are rigidly held on a planar scanning stage 14. A projection lens 16, in conjunction with a fold mirror 18 and reversing unit 20, forms the image of a portion of the mask 10 on the substrate 12. The stage 14 is scanned in a serpentine fashion, imaging the entire mask pattern onto the substrate 12.

A laser 22 provides the illumination for exposure. A lens system (26 and 28) shapes the output beam 24 of the laser, which is focused into the homogenizer 34. The homogenizer 34, which has a hexagonal cross-section, uniformizes the input beam, producing a hexagonal self-luminous radiation source at the output plane. A condenser lens assembly, comprising elements 40 and 42, images the output plane of the homogenizer 34 onto the mask 10, and the illuminated portion of the mask 10 is imaged on to the substrate 12. The efficiency of the homogenizer can be increased by means of energy recycling, by which the light rays that are incident upon the reflective areas of the mask 10 are reflected back toward the homogenizer 34, where they are collected and propagated back toward the mask 10 by means of the energy recycling system. We describe below several embodiments of the illumination system which improve system energy recycling efficiency, resulting in better system performance; and which standardize the homogenizer/condenser design, allowing for reduced cost and lead time for fabrication of the illumination system.

Stepped-Up Homogenizer

Figure 1:
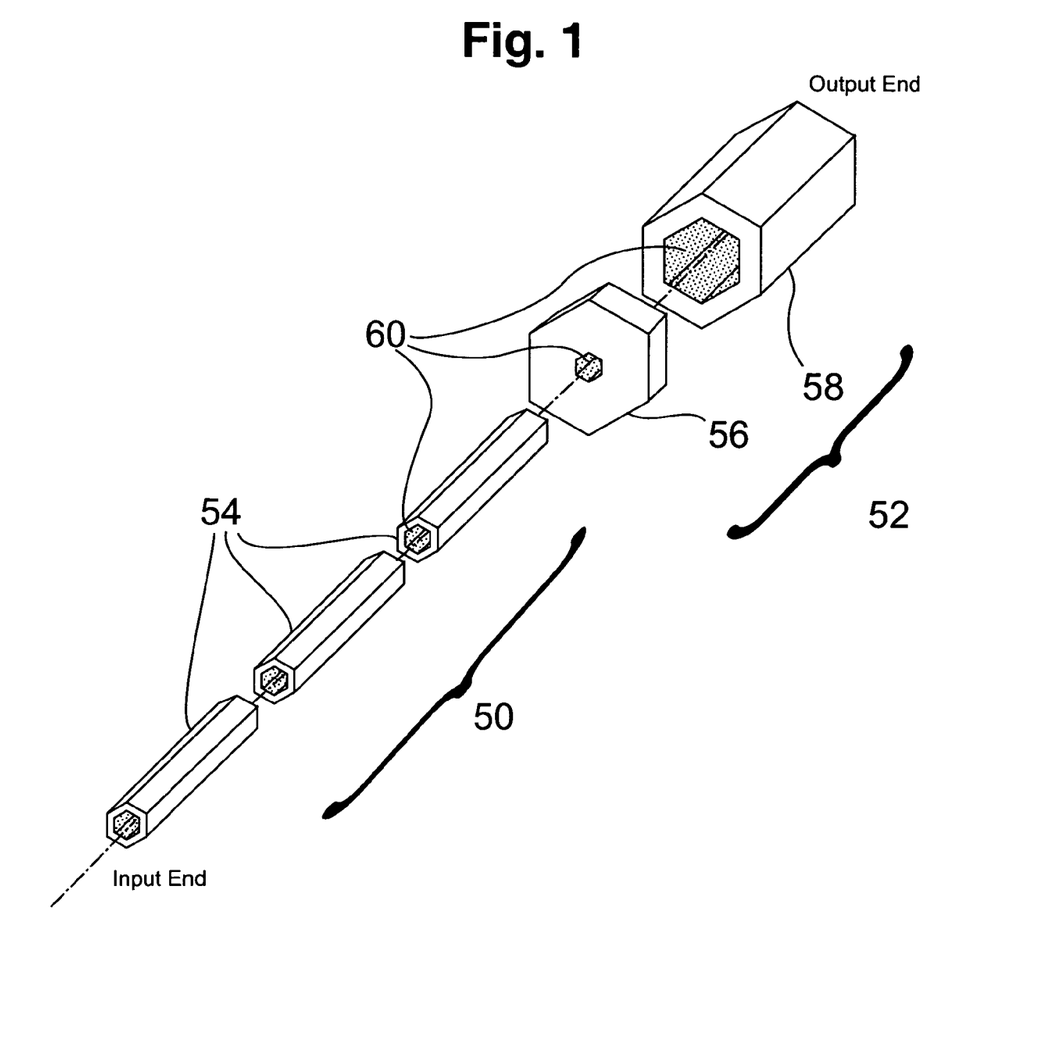
FIG. 1 shows an exploded diagram of a stepped-up homogenizer, featuring a three-segment homogenizing section and a condensing section consisting of a condensing segment and a faceplate segment.

The stepped-up homogenizer unit shown in FIG. 1 consists of two sections 50 and 52, each comprised of segments with highly reflective internal surfaces 60. The sections also have different diameters. The first section 50 is the homogenizing section comprised of homogenizing segments 54; the second section 52 is the condensing section, comprised of a condensing segment 58 and an exit gap plate 56.

Since the required homogenizer length for achieving a highly uniform illumination beam decreases as the homogenizer diameter decreases, the segments 54 comprising the homogenizing section 50 have a small diameter; this minimizes the length of the segments. The condensing segment 58 is larger in diameter than the homogenizing segments 54, typically by a factor of 2× or more. The segments are fabricated separately, and are joined together to form a section simply by butting the segments' faces together. Butting the two sections together against an exit gap plate 56 joins the sections of segments 50 and 52, each section having a different diameter. Note that the homogenizing section 50 is constructed by combining shorter homogenizing segments 54, using just enough segments to ensure a highly homogenized beam. A three-segment homogenizing section 50 is shown here. This approach allows for a 'stockpile' of homogenizing and condensing segments 54 and 58, respectively, to be maintained in house. The homogenizing segments 54 are all identical; the condensing segments 58 of various sizes. Thus a user can rapidly assemble homogenizer units having the desired output diameters simply by selecting the appropriate condensing segment 58.

The following design examples illustrate this approach. For these examples, we assume that the homogenizing segments 54 are standardized to be 5 mm in diameter and 100 mm in length; and that the condensing segments are available in standard diameters of 20, 30, 40, and 50 mm.

Figure 2:
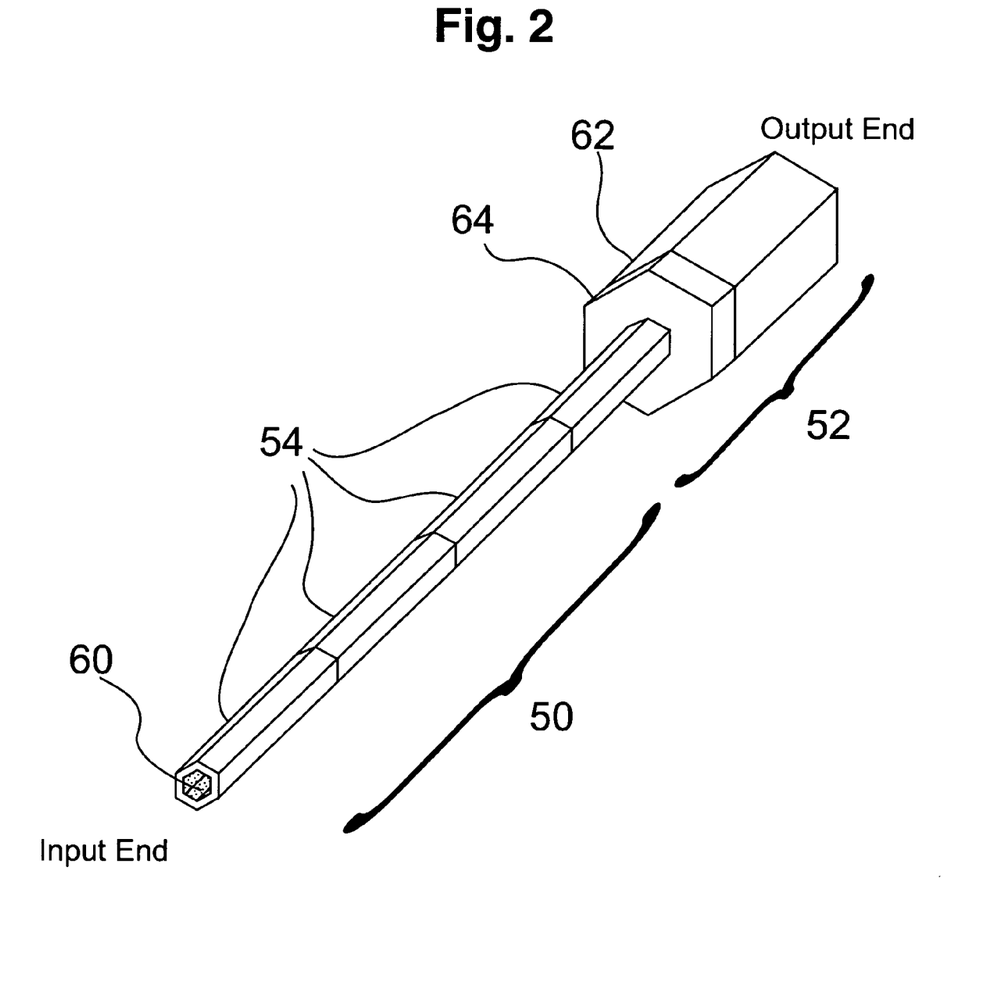
FIG. 2 shows stepped-up homogenizer similar to FIG. 1, but with a four-segment homogenizer section.

FIG. 2 illustrates example 1. Assume the system resolution is 10 μm, the field size is 50 mm, and the imaging system NA is 0.025. For the condenser section 52, we choose a condensing segment 62 with a 50 mm diameter (so the condenser magnification is 1:1) and exit gap plate 64 (to mate the sections). Therefore, the NA inside the homogenizer is 0.025, and we use six of the 5-mm-diameter homogenizing segments 54 (with four homogenizing segments shown), giving a total homogenizing section 50 length of 600 mm to ensure sufficient beam uniformity.

Figure 3:
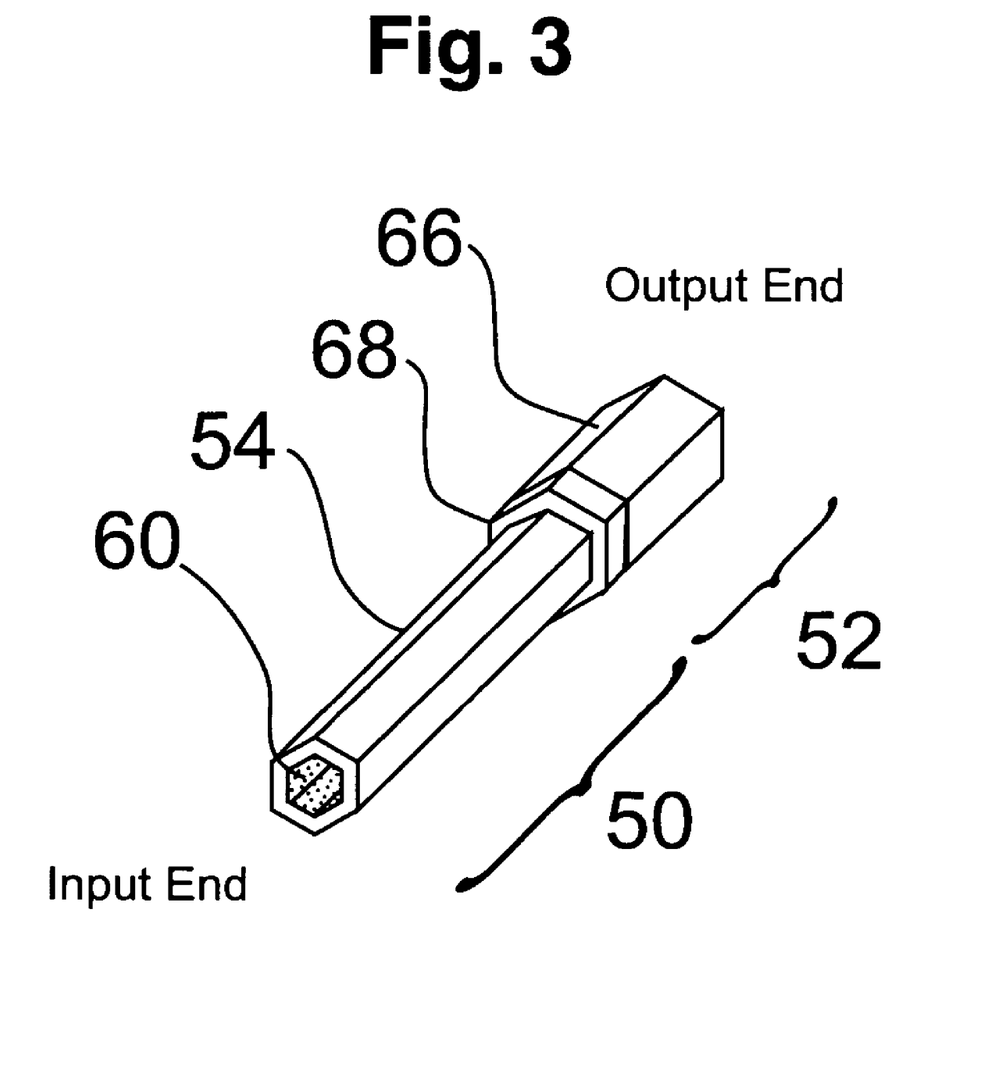
FIG. 3 shows an assembled stepped-up homogenizer, featuring a one-segment homogenizing section and a condensing section consisting of a condensing segment and a faceplate segment. Note that the condensing section is narrower than the condensing section shown in FIGS. 1 and 2.

FIG. 3 illustrates example 2. Assume the system resolution is 1 μm, field size is 10 mm, and imaging system NA is 0.18. For the condensing section, we choose a 10-mm-diameter condensing segment 66 (so the condenser magnification is 1:1) and exit gap plate 68; the NA inside the homogenizer is therefore 0.18. For this configuration, just a single 5-mm-diameter homogenizer segment 54 is sufficient to ensure beam uniformity.

Stepped-Down Homogenizer

Figure 4:
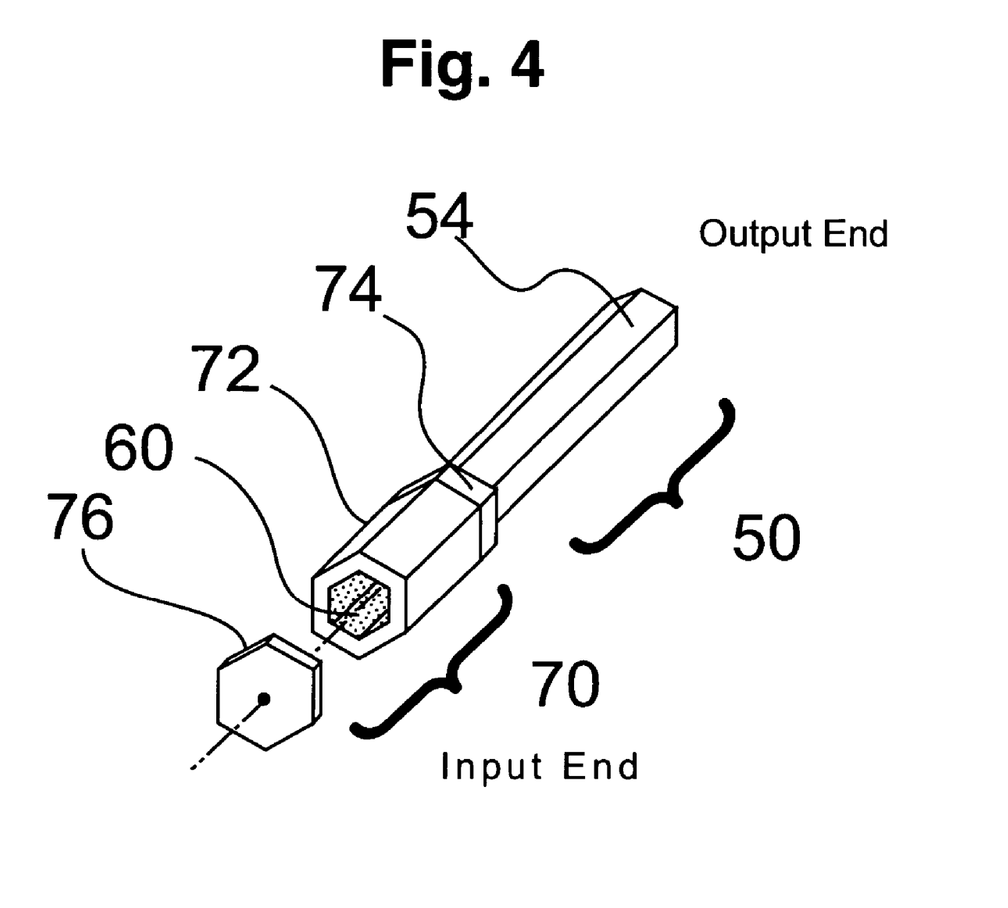
FIG. 4 shows an assembled stepped-down homogenizer featuring a recycling optimizing section (consisting of a recycling optimizing segment and an exit gap plate) and a one-segment homogenizing section.

The stepped-down homogenizer offers greater recycling efficiency, while keeping the homogenizer design principle essentially unchanged. FIG. 4 is an illustration of an assembled stepped-down homogenizer featuring a recycling optimizing section 70 (comprised by a recycling optimizing segment 72 and an exit gap plate 74) and a one-segment homogenizing section 50.

Figure 5:
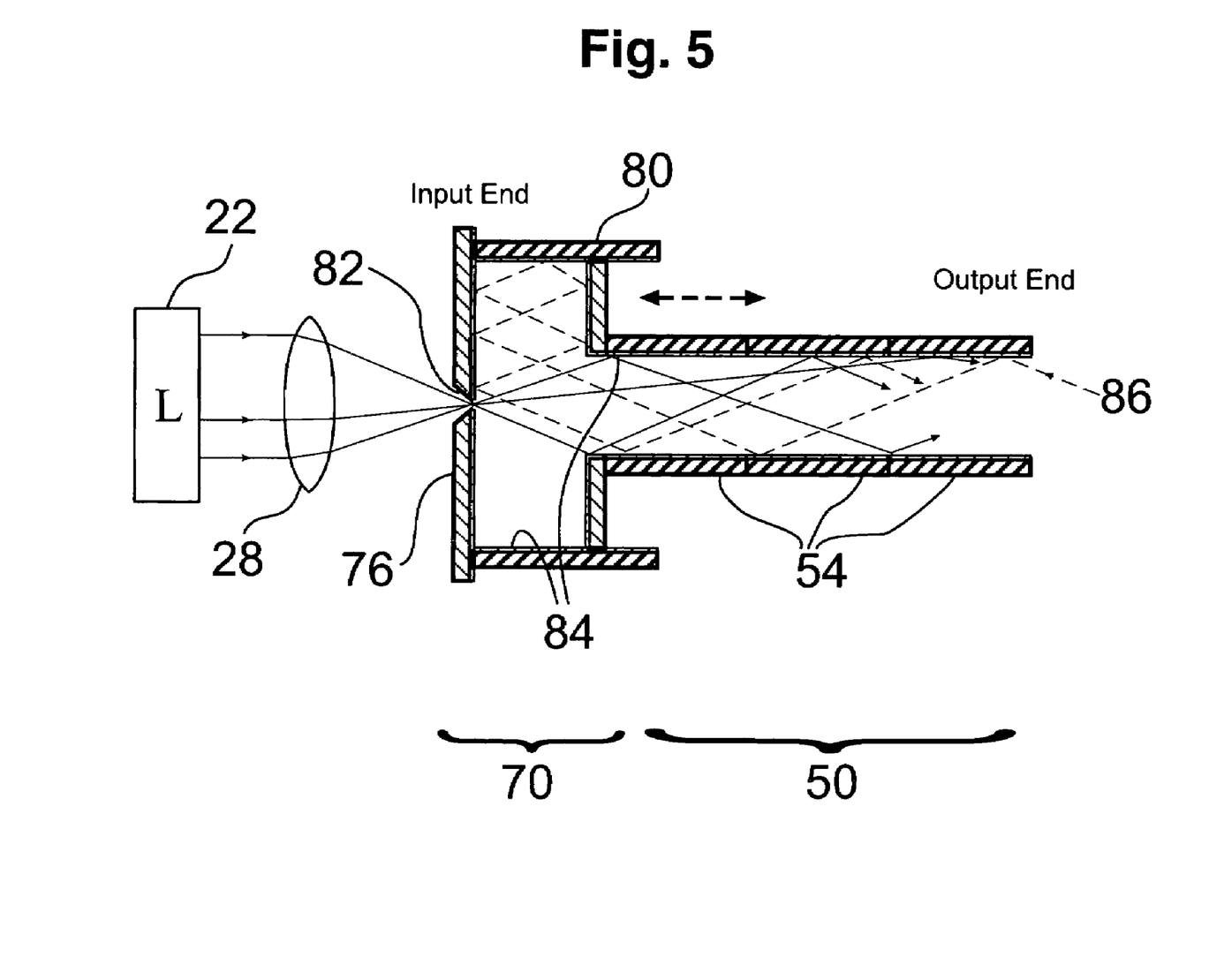
FIG. 5 is a cross-sectional diagram of a stepped-down homogenizer featuring a recycling optimizing section (consisting of an apertured recycling mirror, a recycling optimizing segment, and an exit gap plate for improving system efficiency by a factor of 4–5×) and a three-segment homogenizing section.

We first note that recycling homogenizers, such as the one illustrated in FIG. 5, can improve the optical system efficiency by factors of up to 4–5×, by 'recycling' the radiation reflected from the mask, shown by ray 86, by means of an apertured recycling mirror 76 positioned at the input face of the homogenizer. This stepped-down homogenizer substantially improves upon recycling homogenizer design in that it consists of two sections: a recycling section 70 and a homogenizing section 50. The recycling optimizing segment 80 is typically at least 2× greater in diameter than the homogenizing segment 54. The advantage of the stepped-down homogenizer is evident by considering that the recycling efficiency, R, increases with the ratio of the area of the whole apertured recycling mirror, $A_{refl}$, to the area, $A_{op}$, of the opening 82 in the apertured recycling mirror 76, according to $$R \sim 1 - \left(\frac{A_{op}}{A_{refl}}\right).$$

Further, the size of the opening 82 in the apertured recycling mirror 76 is determined by the minimum focus spot size that can be obtained with an excimer laser 22.

We note that all interior surfaces 60 of the stepped-down homogenizer are coated for reflectivity according to their function. The horizontal surfaces, such as those shown by 84, are coated for high reflectivity for angles corresponding to the NA of the beam within the homogenizer, and the vertical surfaces, such as the one shown by 76, are coated for high-reflectivity for near-normal incidence. We also note that the stepped-down homogenizing section 50, which accounts for the majority of the illumination system length, slides (as indicated by the dashed arrow) within the stepped-up recycling section 80, allowing for optimization of the length of the stepped-up recycling section, and thus optimization of the illumination system throughput.

Stepped-Down-and-Up Homogenizer

The stepped-up and stepped-down configurations described above consisted of only two sections each. The stepped-up homogenizer includes a homogenizing section and a condensing section, while the stepped-down homogenizer includes a homogenizing section and a recycling optimizing section. This stepped-down-and-up configuration, shown in FIG. 6, utilizes a recycling optimizing section 70 on its input side, like a stepped-down homogenizer, and a condensing section 52 on its output side, like a stepped-up homogenizer. Like both earlier-mentioned configurations, the stepped-down-and-up homogenizer includes a set of one or more homogenizing segments 54, which comprise the homogenization section 50.

Figure 6:
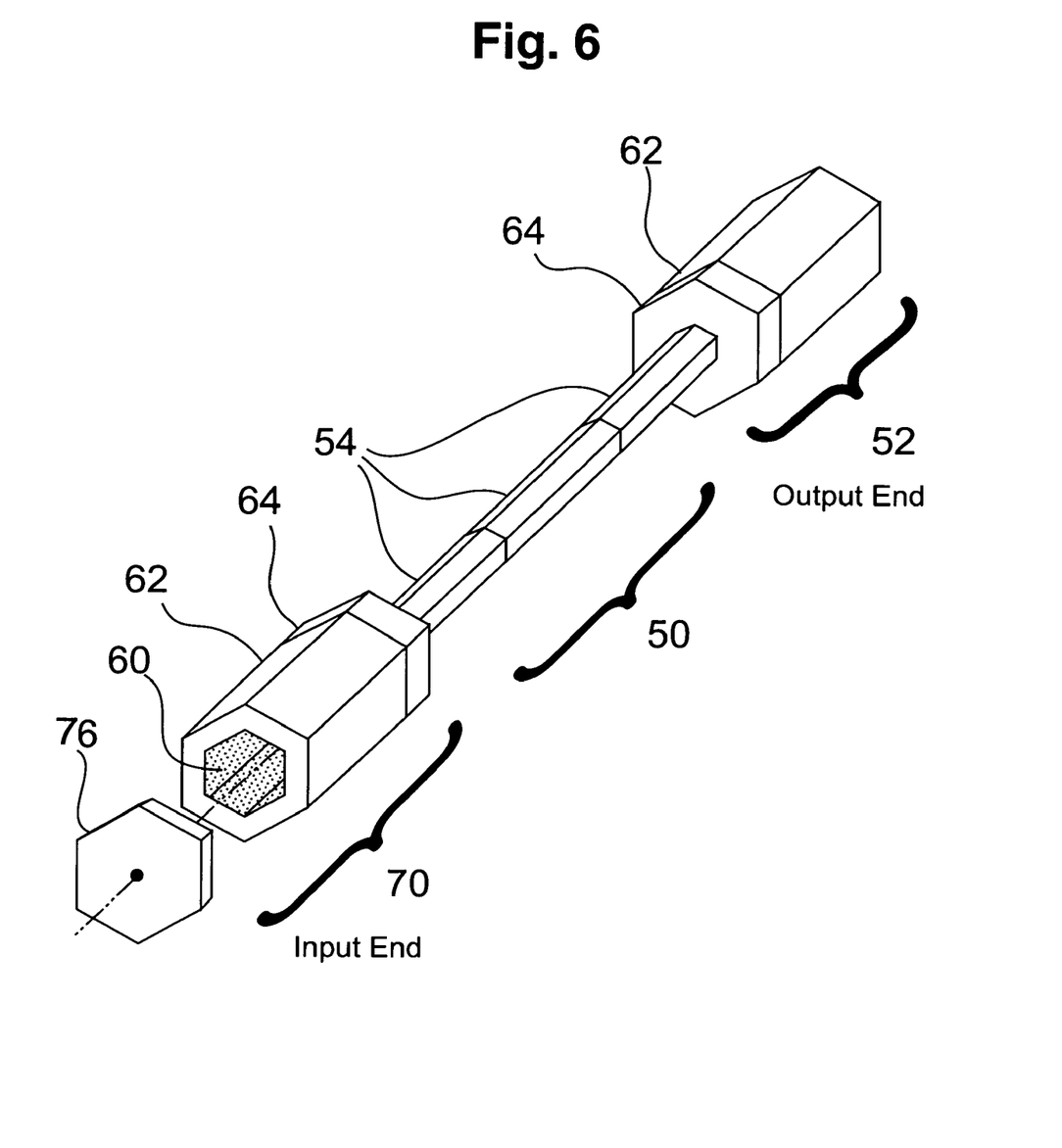
FIG. 6 shows a solid homogenizer configured with a hollow pre-homogenizing section to minimize the possibility of damage to the input end of the solid homogenizer.

This configuration retains the benefits of the recycling optimization capability of the recycling optimization section and the optical matching capability of the condensing section. This illustration also includes a drawing of a apertured recycling mirror 76 positioned at the input face of the homogenizer.

Solid Homogenizer

Figure 7:
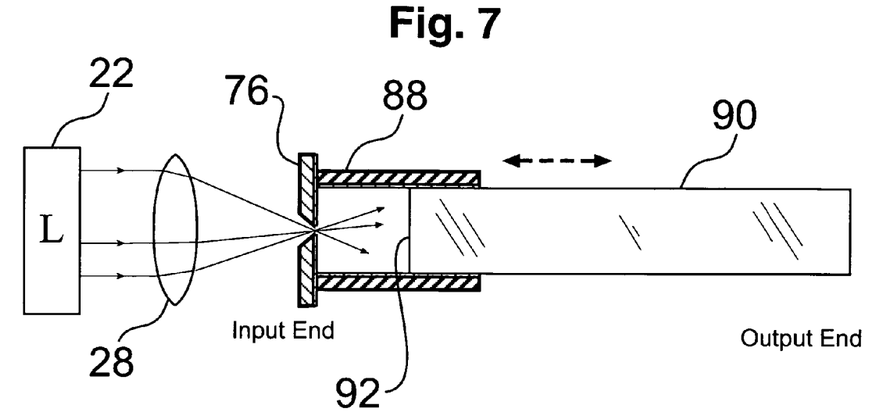
FIG. 7 shows a stepped-down solid homogenizer, which improves the recycling efficiency, compared with the design of FIG. 6.

The solid homogenizer, shown in FIG. 7, is an alternative to the hollow homogenizer. Made of high-transparency fused silica, the solid homogenizer operates by total internal reflection (TIR), offering high efficiency given that TIR is a very low loss process. Additionally, compared with the hollow homogenizer, the uniformity may be improved because the homogenizer is monolithic (manufactured in one piece), leaving no paths for light leakage which could result in hot/cold regions at the output end. To operate the solid homogenizer in energy recycling mode, first recall that for efficient energy recycling, the input beam should be focused as tightly as possible at the input face (the apertured recycling mirror) of the homogenizer, so that the ratio $$\left(\frac{A_{op}}{A_{refl}}\right)$$

can be minimized, thereby optimizing the recycling efficiency. However, for a solid homogenizer, a tightly focused beam could damage the input face due to the high intensity.

One way to address this problem is to increase the focus area so that the input energy density is below the damage threshold for fused silica.

For example, if we consider a system operating with a high-power excimer laser, producing 650 mJ/pulse, then, taking into account losses in the optical train, the typical fluence at the input-end of the homogenizer would be 600 mJ/pulse. If this were focused down to a 1.5-mm-diameter spot at the input end of the solid homogenizer, the energy density would be approximately 33 J/cm$^2$, well above the typical damage threshold for fused silica, which is around 5 J/cm$^2$. The focus spot size, and, hence, the input-end aperture, would thus have to be increased to approximately 3.9 mm in diameter in order to bring the energy density down to the 5 J/cm$^2$ range, resulting in a loss of recycling efficiency.

Figure 8:
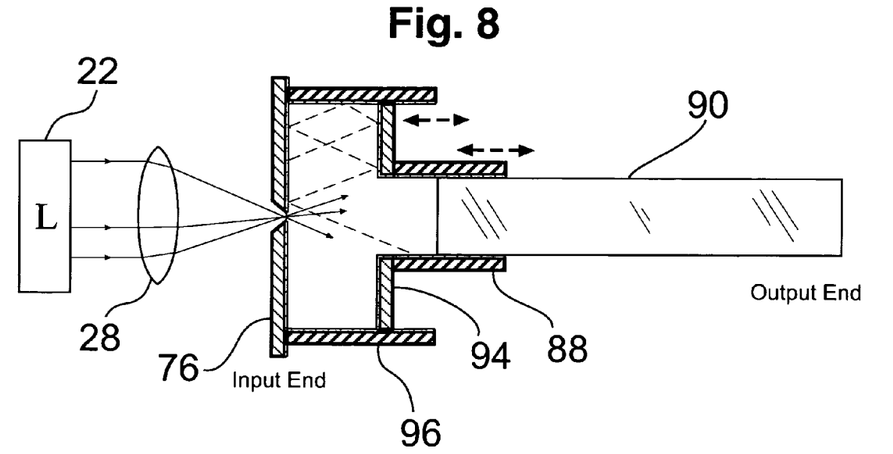
FIG. 8 shows a recycling stepped-down homogenizer with a tapered transition to the stepped-down segment.

Efficiency can be significantly increased by using a hollow pre-homogenizer recycling optimizing segment 88, as shown in FIG. 7, installed on the input end 92 of the homogenizer 90, with an apertured recycling mirror 76 on the end of the hollow segment 88. With this configuration, the laser is focused to a tight spot on the input end of the hollow recycling segment (the aperture of the apertured recycling mirror), rather than the input face of the solid homogenizer 90. This allows the input beam to be focused down to a spot size of approximately 1.5 mm or less without any risk of damaging the input face 92 of the solid homogenizer 90, thereby increasing the optimum recycling efficiency. Note that the solid homogenizer segment 90 slides within the hollow recycling optimizing segment 88, allowing for optimization of the illumination system throughput. Additionally, note that the stepped-down homogenizer design can be combined with the solid homogenizer to improve recycling efficiency, as shown in FIG. 8, by adding an exit gap plate 94 and a larger-diameter recycling optimizing segment 96.

Tapered Homogenizer

Figure 9:
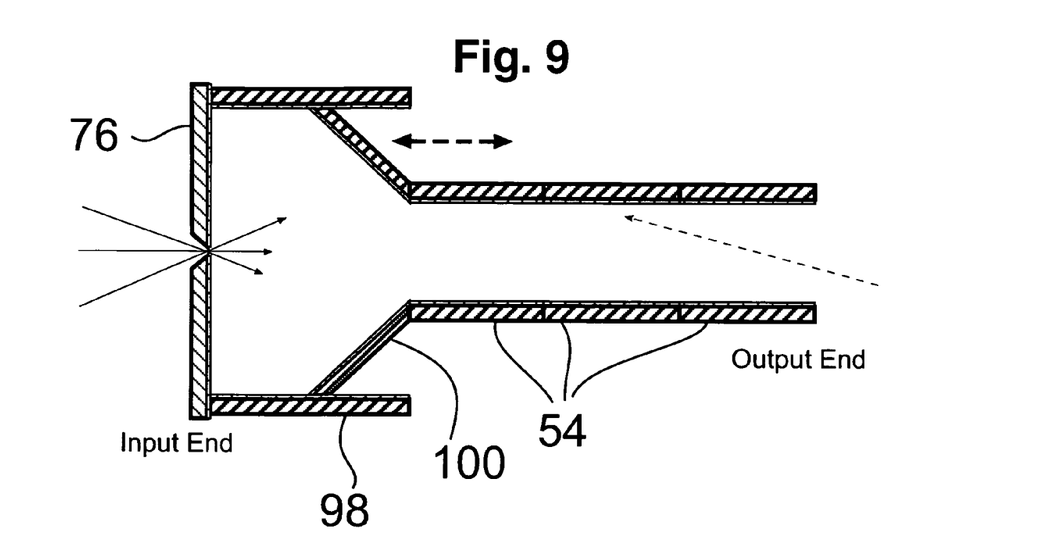
FIG. 9 shows a stepped-up homogenizer with a tapered transition to the stepped-up segment.
Figure 10:
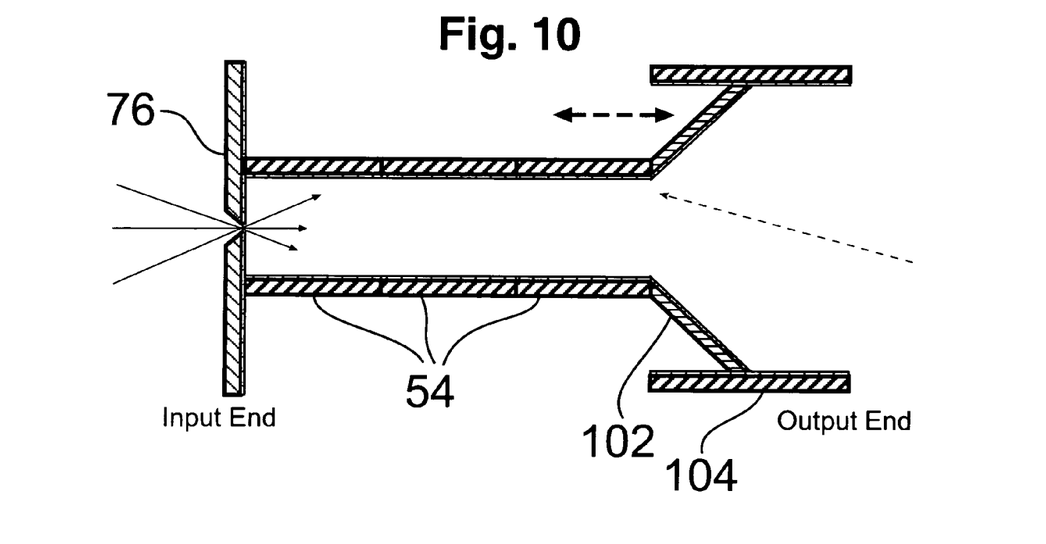
FIG. 10 shows a partially disassembled stepped-up and stepped-down homogenizer, featuring a recycling optimizing section, a three-segment homogenizing section and a condensing section.

The tapered homogenizer is an alternative to the stepped-up/stepped-down homogenizer design. It uses a tapered step to transition from the smaller/larger input section, to the larger/smaller output section. As shown in FIG. 9 and FIG. 10, a tapered homogenizer is constructed from at least three separate segments. In the case of the stepped-down version, these segments are a recycling optimizing segment 98, a tapered exit gap plate 100, and one or more homogenizing segments 54. In the case of the stepped-up version, these segments are one or more homogenizing segments 54, a tapered exit gap plate 102, and a condensing segment 104.

We claim:

1. The method of providing patterning illumination in an exposure system, characterized by the following steps:

Step 1) Providing a high-intensity radiation beam in a tight focus;

Step 2) Passing such radiation beam through a small entry aperture in an aperture plate, such aperture plate having a mirrored back surround, such aperture providing opening into an entry chamber with internal mirrorization and having a rear closure with an exit gap significantly greater in area than said entry aperture Step 3) Passing a significant portion of such radiation beam through such exit gap to a homogenization section extending away from such chamber toward a utilization station having the characteristic of accepting for utilization only a portion of the radiation applied, and reflecting another portion of the radiation applied, such reflection going all the way back through homogenizer and entry chamber to be re-reflected by the mirrorized surround of such entry aperture with only an insignificant fraction of such reflection passing out such entry aperture because of a wider focus encompassing such entry aperture surround; and Step 4) Providing for a portion of the radiation beam not passing through such exit gap to strike a mirrorized surround about such exit gap, for re-reflecting back to the entry aperture surround and chamber walls for additional homogenization and recycling.

2. The method of providing patterning illumination in an exposure system, characterized by the following steps:

Step 1) Providing a high-intensity radiation beam in a tight focus;

Step 2) Passing such radiation beam through a small entry aperture in an aperture plate, such aperture plate having a mirrored back surround, such aperture providing opening into an entry chamber with internal mirrorization and having a rear closure with an exit gap significantly greater in area than said entry aperture Step 3) Passing a significant portion of such radiation beam through such exit gap to a homogenization section extending away from such chamber toward a utilization station having the characteristic of accepting for utilization only a portion of the radiation applied, and reflecting another portion of the radiation applied, such reflection going all the way back through homogenizer and entry chamber to be re-reflected by the mirrorized surround of such entry aperture with only an insignificant fraction of such reflection passing out such entry aperture because of a wider focus encompassing such entry aperture surround; and Step 4) Providing for a portion of the radiation beam not passing through such exit gap to strike a mirrorized surround about such exit gap, at an angle which corresponds to a reflectivity-optimized angle of such mirrorized surround, for re-reflecting back to the entry aperture surround and chamber walls for additional homogenization and recycling.

* * * * *